United States Patent
Pioch et al.

(10) Patent No.: US 10,481,979 B2
(45) Date of Patent: Nov. 19, 2019

(54) STORAGE SYSTEM, COMPUTING SYSTEM, AND METHODS THEREOF

(71) Applicant: Intel Corporation, Santa Clara, CA (US)

(72) Inventors: Marcin Pioch, Gdansk (PL); Kapil Karkra, Chandler, AZ (US); Piotr Wysocki, Gdansk (PL); Slawomir Ptak, Gdansk (PL)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 15/718,031

(22) Filed: Sep. 28, 2017

(65) Prior Publication Data

US 2019/0095281 A1   Mar. 28, 2019

(51) Int. Cl.
G06F 11/10        (2006.01)
G11C 29/52        (2006.01)
G11C 29/00        (2006.01)

(52) U.S. Cl.
CPC ...... G06F 11/1076 (2013.01); G06F 11/1068 (2013.01); G11C 29/52 (2013.01); G11C 29/74 (2013.01)

(58) Field of Classification Search
CPC ............. G06F 11/1076; G06F 11/1088; G06F 3/0619; G06F 3/06; G06F 3/0626; G06F 11/1068
See application file for complete search history.

(56) References Cited

U.S. PATENT DOCUMENTS

| | | | | |
|---|---|---|---|---|
| 2002/0166077 A1* | 11/2002 | Jacobson | ............... | G06F 3/0626 714/6.12 |
| 2003/0023809 A1* | 1/2003 | Oldfield | ............... | G06F 11/1076 711/114 |
| 2003/0163757 A1* | 8/2003 | Kang | ................... | G06F 11/1076 714/6.12 |
| 2013/0117603 A1* | 5/2013 | Jess | ...................... | G06F 11/1088 714/6.22 |
| 2015/0135006 A1* | 5/2015 | Samanta | ................... | G06F 3/06 714/6.24 |
| 2017/0277450 A1* | 9/2017 | Ish | ......................... | G06F 3/0619 |

* cited by examiner

*Primary Examiner* — Shelly A Chase
(74) *Attorney, Agent, or Firm* — Viering, Jentschura & Partner MBB

(57) ABSTRACT

According to various aspects, a storage system is provided, the storage system including a multiplicity of storage devices, and one or more processors configured to store user data on the multiplicity of storage devices, the stored user data being distributed among the multiplicity of storage devices together with redundancy data and with log data; generate a classification associated with the redundancy data and the log data to provide classified redundancy data and classified log data, and write the classified redundancy data and the classified log data on the respective storage device of the multiplicity of storage devices according to the classification associated therewith.

13 Claims, 10 Drawing Sheets

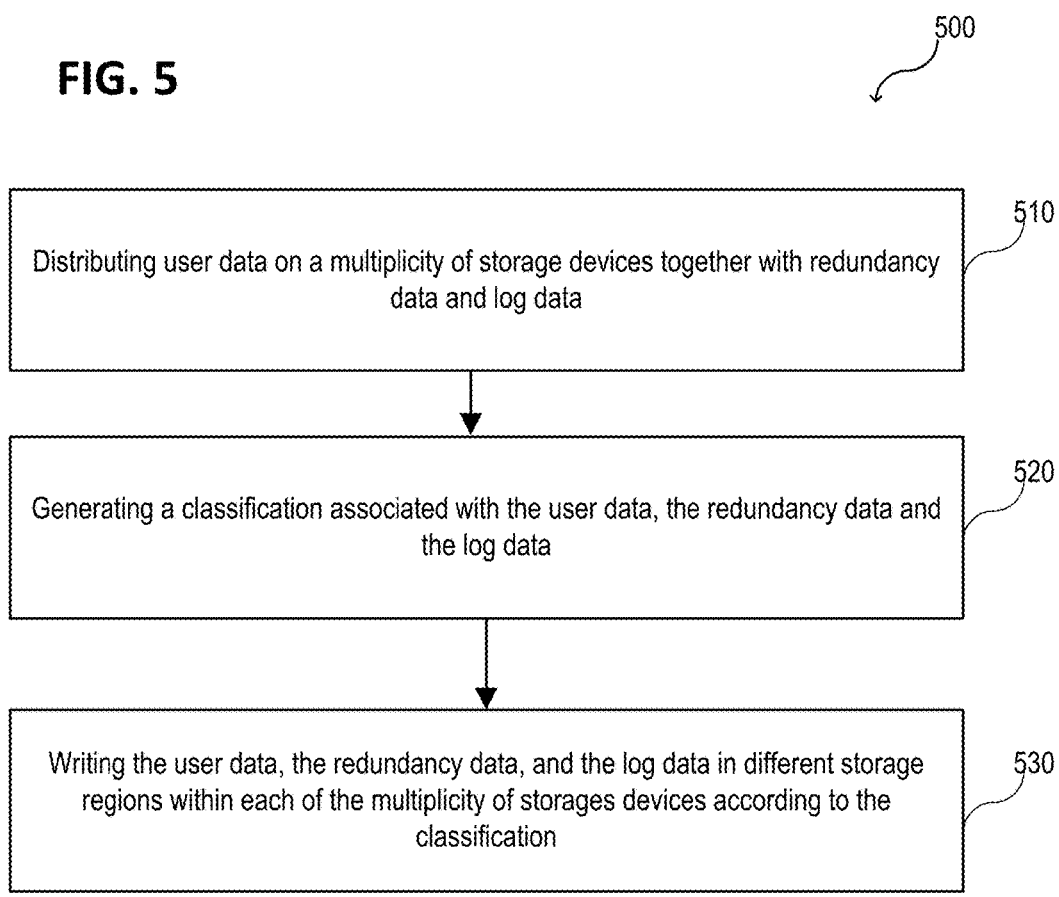

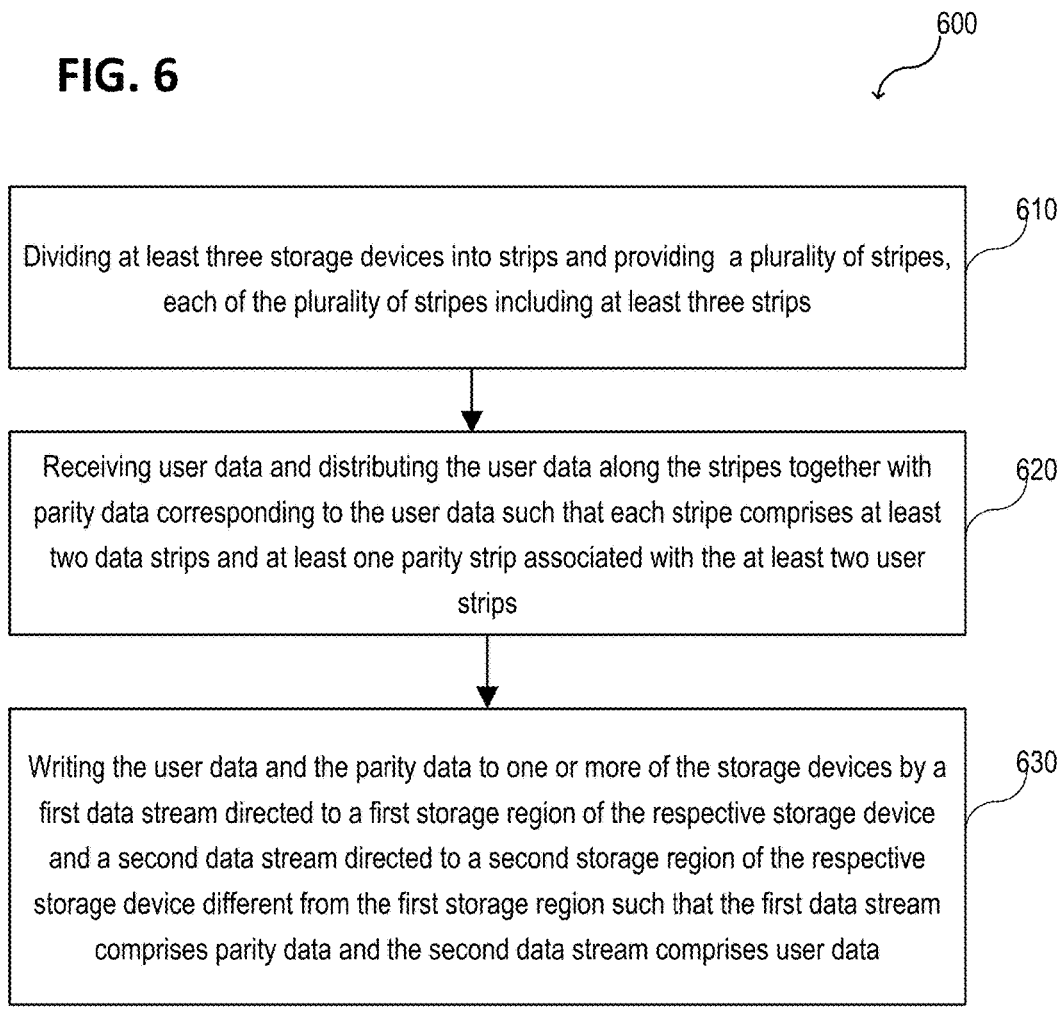

STORAGE SYSTEM, COMPUTING SYSTEM, AND METHODS THEREOF

TECHNICAL FIELD

Various aspects relate generally to a storage system and a method for operating a storage system.

BACKGROUND

In general, an efficient data handling, e.g., including storing, updating, and/or reading data, may become more and more important, since for example data volume and data traffic increases with modern technologies. In one or more applications, data are stored in a RAID (Redundant Array of Independent Disks or Redundant Array of Independent Drives) technique. The RAID storage technique may be implemented in hardware, also referred to as hardware RAID, or as a software, also referred to as software RAID, or in both hardware and software, also referred to as hybrid RAID or host RAID. A RAID storage technique may be provided in various types or modifications. These types or modification may differ from each other with respect to the number of used storage devices, the type of dividing, and/or addressing respective storage devices, and/or the embedded functions to prevent data loss in case of one or more of the used storage devices fail. The different types of RAID storage techniques may be referred to as RAID levels. At present, several standard and non-standard RAID levels may be used, e.g., RAID-0, RAID-1, RAID-5, and RAID-6, etc. However, there may be various combinations or modifications of the standard and non-standard RAID levels leading to a large number of possible RAID levels, e.g., RAID-01, RAID-05, RAID-10, RAID-1.5, RAID-15, RAID-1E, RAID-1E0, RAID-30, RAID-45, RAID-50, RAID-51, RAID-53, RAID-55, RAID-5E, RAID-5EE, RAID-5DE, RAID-60, Matrix-RAID, RAID-S, RAID-TP, RAID-Z, and the like.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 5 shows a schematic flow diagram of a method for operating a storage system, according to various aspects;

FIG. 6 shows a schematic flow diagram of a method for operating a storage system, according to various aspects;

DESCRIPTION

Figure 1:
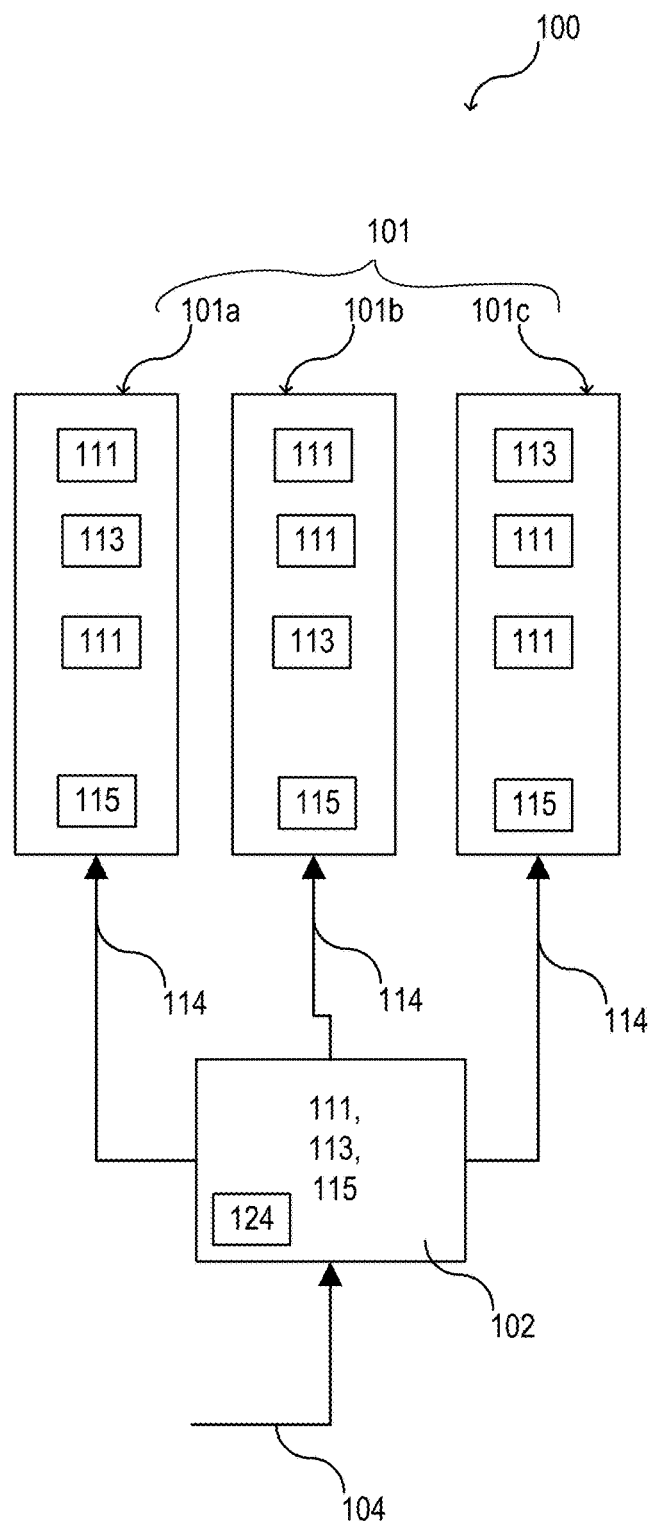
FIG. 1 shows a storage system in a schematic view, according to various aspects.

The following detailed description refers to the accompanying drawings that show, by way of illustration, specific details and aspects in which the disclosure may be practiced. These aspects are described in sufficient detail to enable those skilled in the art to practice the disclosure. Other aspects may be utilized and structural, logical, and electrical changes may be made without departing from the scope of the disclosure. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g., "a plurality of [objects]," "multiple [objects]") referring to a quantity of objects expressly refers more than one of the said objects. The terms "group (of)," "set [of]," "collection (of)," "series (of)," "sequence (of)," "grouping (of)," etc., and the like in the description and in the claims, if any, refer to a quantity equal to or greater than one, i.e. one or more.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example aspects.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer.

The term "processor" or "controller" as for example used herein may be understood as any kind of entity that allows handling data. The data may be handled according to one or more specific functions executed by the processor or controller. Further, a processor or controller as used herein may be understood as any kind of circuit, e.g., any kind of analog or digital circuit. The term "handle" or "handling" as for example used herein referring to data handling, file handling or request handling may be understood as any kind of operation, e.g., an I/O operation, or any kind of logic operation. An I/O (Input/Output) operation may be, for example, storing (also referred to as writing) and reading.

A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

In current technologies, differences between software and hardware implemented data handling may blur, so that it has to be understood that a processor, controller, or circuit detailed herein may be implemented in software, hardware or as hybrid implementation including software and hardware.

The term "system" (e.g., a storage system, a RAID system, a computing system, etc.) detailed herein may be understood as a set of interacting elements; the elements can be, by way of example and not of limitation, one or more mechanical components, one or more electrical components, one or more instructions (e.g., encoded in storage media), one or more processors, and the like.

The term "storage" (e.g., a storage device, a storage system, etc.) detailed herein may be understood as any suitable type of memory or memory device, e.g., a hard disk drive (HDD), a solid-state drive (SSD), and any other suitable memory device. The term storage may be used herein to mean a permanent storage of data based for example on a non-volatile memory.

As used herein, the term "memory", "memory device", and the like may be understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™ technology, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component including one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

A volatile memory may be a storage medium that uses power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In some aspects, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Various aspects may be applied to any memory device that includes non-volatile memory. In one aspect, the memory device is a block addressable memory device, such as those based on negative-AND (NAND) logic or negative-OR (NOR) logic technologies. A memory may also include future generation non-volatile devices, such as a 3D XPoint™ technology memory device, or other byte addressable write-in-place non-volatile memory devices. A 3D XPoint™ technology memory may include a transistor-less stackable cross-point architecture in which memory cells sit at the intersection of word lines and bit lines and are individually addressable and in which bit storage is based on a change in bulk resistance.

In some aspects, the memory device may be or may include memory devices that use chalcogenide glass, multi-threshold level NAND flash memory, NOR flash memory, single or multi-level phase change memory (PCM), a resistive memory, nanowire memory, ferroelectric transistor random access memory (FeTRAM), anti-ferroelectric memory, magneto resistive random access memory (MRAM) memory that incorporates memristor technology, resistive memory including the metal oxide base, the oxygen vacancy base and the conductive bridge random access memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The terms memory or memory device may refer to the die itself and/or to a packaged memory product.

According to various aspects, a computing system and/or a storage system may be provided, the computing system and/or the storage system including a RAID based on a multiplicity of member storage devices and one or more policies to handle data written on the respective member storage devices efficiently. Illustratively, a RAID system or, in other words, a computing system and/or a storage system implementing one or more RAID functions, may be provided. Further, as a corresponding method for operating a RAID system may be provided.

According to various aspects, the RAID system described herein may be based on striping (e.g., on bit-level, byte-level, or block-level striping) with distributed redundancy information. According to various aspects, the RAID system described herein may be a RAID-5, RAID-6 or a RAID level based thereon. According to various aspects, the RAID system described herein may be based on block-level striping with distributed parity blocks. According to various aspects, parity information may be used as redundancy information for error correction, e.g., for preventing an information loss in the case that one of the member storage devices of the RAID system fails. Various aspects are related to a RAID (e.g. 5/6/EC) having a parity and write ahead log classification for physical data placement on a storage device, e.g. for NAND physical data placement.

As an example, RAID-5 may implement block-level striping with distributed parity. The parity data may be distributed among the storage devices used in the RAID system (also referred to as member storage devices or member drive). During operation of the RAID system, a member storage device may fail or any other error may occur. In this case, data of one of the member storage device may be lost. These lost data may be recalculated based on the distributed parity data and data from the remaining storage devices. According to various aspects, a RAID system based on striping with distributed parity data may include at least three storage devices. In this case, at least three single physical drives may be used, e.g., at least three hard disk drives or at least three solid-state drives or some combination thereof. Alternatively, at least three logical storage devices may be used, e.g. in a virtualization, independently from the number of underlying physical drives.

According to various aspects, parity data (or other suitable redundancy information) may be used in a RAID system for fault tolerance. Parity data may be provided by a calculation based on data (referred to herein as user data) from two or more of the member storage devices. The parity data (as the result of the calculation) may be stored on another one of the member storage devices. The calculation may be based on a logical XOR (Exclusive OR gate) operation that illustratively provides an information of the parity. However, other logical operations than XOR may be used in a similar way to provide redundancy data.

In general, in the case that a RAID system crashes, a parity inconsistency may occur. As an example, a system crash or another interruption of an I/O operation may end up in a corrupted state in which the parity information may be inconsistent with corresponding user data. From this corrupted state, the parity information may be insufficient to data recovery. The corrupted state may occur in the case that one of the user data or parity data is written and no corresponding write operation is done for the other one. In a RAID system, the parity inconsistency issue may be also referred to as write hole or RAID write hole. Thus, the RAID write hole may be a data corruption issue, e.g., caused by interrupted write operations of the used data and the corresponding parity data.

FIG. 1 illustrates a storage system 100 in a schematic view, according to various aspects. The storage system 100 may be a RAID storage system, as described above. The storage system 100 may include a multiplicity of storage devices 101, also referred to as member storage devices. As an example, a number of three storage devices 101a, 101b, 101c is illustrated in FIG. 1. However, more than three storage devices may be used in a similar way, e.g., four storage devices 101 may be used in a RAID-5 configuration, five storage devices may be used in a RAID-6 configuration, and the like.

According to various embodiments, the storage system 100 may include one or more processors 102. The one or more processors 102 may be configured to receive 104 user data 111 to be stored. The one or more processors 102 may be configured to distribute the user data 111 to be stored among the multiplicity of storage devices 101. The user data 111 may be distributed among the multiplicity of storage devices 101 and stored therein with corresponding redundancy data 113 for data recovery. Through this interaction, user data may be recovered in case that, for instance, one of the plurality of storage devices fail. Further, log data 115 (e.g., corresponding to the redundancy data 113 and/or user data 111) may be distributed among the multiplicity of storage devices 101 for write hole protection. The data (e.g. the user data 111 and/or the redundancy data 113) may be distributed across the multiplicity of storage devices 101 via striping, e.g., on bit-level, byte-level, or block-level.

According to various aspects, the one or more processors 102 may be configured to generate a classification 124 associated with the redundancy data 113 and/or the log data 115. Illustratively, classified redundancy data 113 and classified log data 115 may be provided. The classification 124 may be implemented based on a classification tag associated with the respective data or type of data, based on a lookup table associated with the respective data or type of data, or the like.

Further, according to various aspects, the one or more processors 102 may be configured to write 114 the redundancy data 113 and the log data 115 on the respective storage device of the multiplicity of storage devices according to the classification 124 associated therewith.

In a similar way, the user data 111 may be classified. In this case, the one or more processors 102 may be configured to write 114 the user data 113 on a respective storage device of the multiplicity of storage devices according to the classification 124 associated therewith.

According to various aspects, the redundancy data 113 may be parity data. Parity data may be, for example, calculated with a XOR operation. In the following, various examples are provided referring to parity data 113; however, any other redundancy data 113 that are suitable for data recovery (e.g., in the case that one of the multiplicity of storage devices fails) may be used in a similar way. According to various aspects, log data 115 for write hole protection may be also referred to as write ahead log data.

According to various aspects, the classification 124 may provide a basis to place (e.g. physically arrange) the data 111, 113, 115 on each storage device of the multiplicity of storage devices 101 according to the classification 124, additionally to the respective distribution of the data 111, 113, 115 among the multiplicity of storage devices 101.

Figure 2:
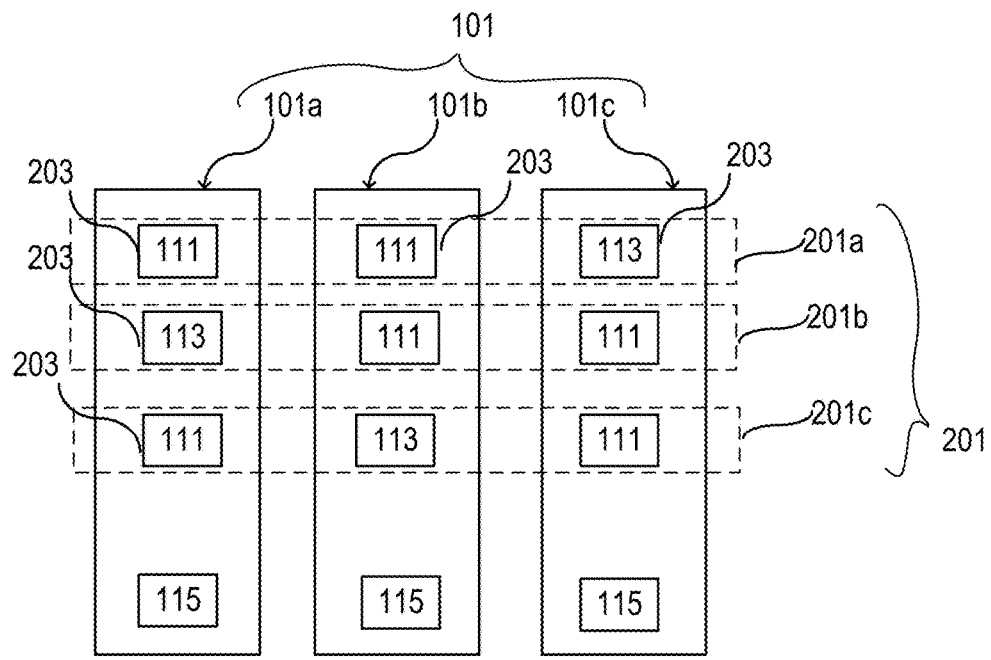
FIG. 2 shows a multiplicity of storage devices of a storage system in a schematic view, according to various aspects.

FIG. 2 illustrates the multiplicity of storage devices 101, according to various aspects. The multiplicity of storage devices 101 may be part of a storage system 100 as described herein.

According to various embodiments, the multiplicity of storage devices 101 may be configured in striping configuration (also referred to as RAID striping, disk striping, drive striping, or the like). In this case, the user data 111 to be stored may be distributed across multiple physical drives. In some aspects, however, data 111 to be stored may be distributed across multiple logical drives. Each of the multiplicity of storage devices 101 may be divided into strips 203. Across the multiplicity of storage devices 101, the strips 203 may form a plurality of stripes 201. Stated differently, each of the plurality of stripes 201 may include multiple strips 203. In other words, the storage devices 101a, 101b, 101c of the multiplicity of storage devices 101 may be divided into strips 203. One strip 203 from each of the multiplicity of storage devices 101 may provide a stripe 201 across the multiplicity of storage devices 101.

According to various embodiments, data, e.g., the user data 111 and/or the redundancy data 113 may be written into the strips 203 along respective stripes 201. Each strip 203 may be associated with a storage block (e.g., in block-level striping). Each of the storage blocks may have a pre-defined block size, e.g., 128 kiB. However, other block sizes may be used in a similar way.

According to various aspects, the one or more processors 102, as described herein, may be configured to distribute the parity data 113 across the multiplicity of storage devices 101, as for example illustrated in FIG. 1 and FIG. 2. As an example, the parity data 113 of the first stripe 201a may be written into the corresponding strip 203 of the third storage device 101c of the multiplicity of storage devices 101, the calculation of these parity data 113 may be based on the user data 111 that are written in the corresponding strips 203 of the first storage device 101a and the second storage device 101b of the multiplicity of storage devices 101. Further, the parity data 113 of the second stripe 201b may be written into the corresponding strip 203 of the first storage device 101a of the multiplicity of storage devices 101, the calculation of these parity data 113 may be based on the user data 111 that are written in the corresponding strips 203 of the second storage device 101b and the third storage device 101c of the multiplicity of storage devices 101. Further, the parity data 113 of the third stripe 201c may be written into the corresponding strip 203 of the second storage device 101b of the multiplicity of storage devices 101, the calculation of these parity data 113 may be based on the user data 111 that are written in the corresponding strips 203 of the first storage device 101a and the third storage device 101c of the multiplicity of storage devices 101. And so on. Further, the log data 115 for each of the write operations may be written to the respective storage device accordingly.

For each writing of user data 111 into the respective strip 203, the parity data 113 of the stripe 201 may be updated correspondingly to preserve parity consistency. Therefore, parity data 113 may be written statistically more often than user data 111, since two or more user data strips 203 are included in each of the stripes 201 corresponding to one parity data strip.

Figure 8A:
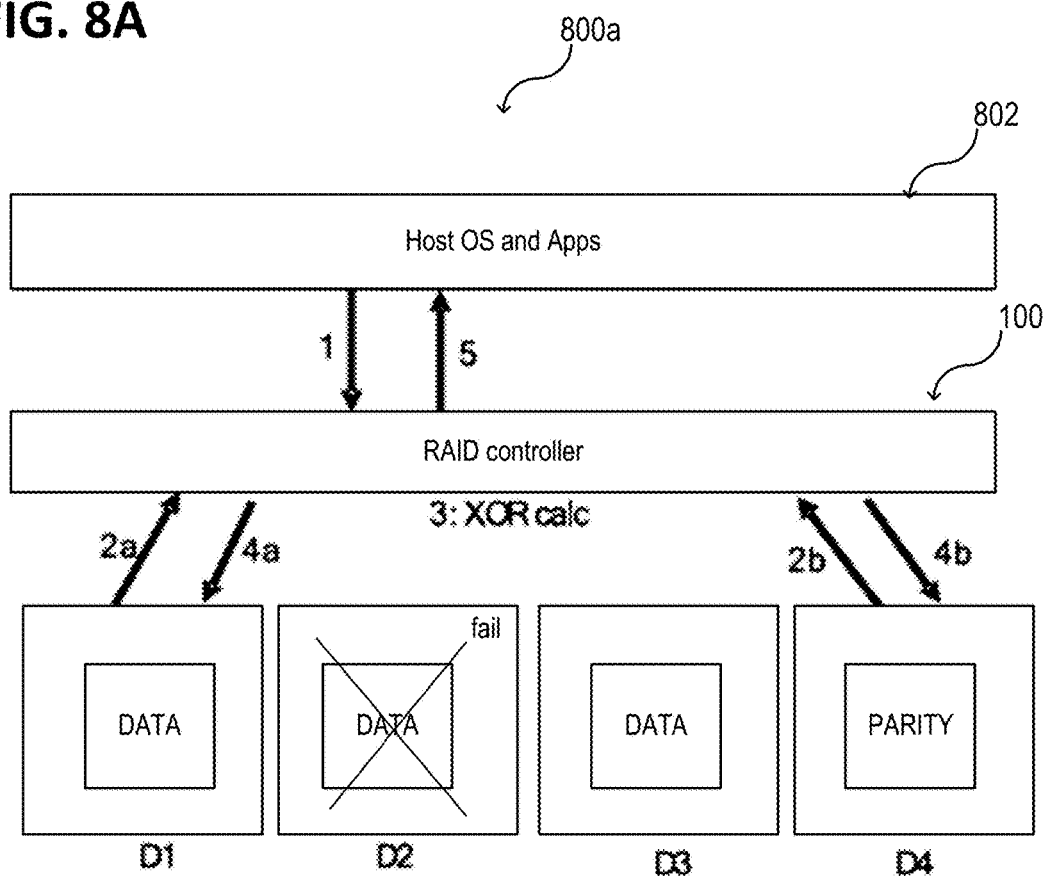
FIG. 8A shows a storage system and a schematic view of accessing the storage system in a schematic view, according to various aspects.

Further, the log data 115 for each writing operation may be written statistically more often than user data 111, e.g., for each parity data 113 write operation a corresponding log data 115 write operation may be carried out, see for example FIG. 8A.

According to various aspects, providing a classification 124 for the user data 111, the parity data 113 and/or the log data 115 may allow to store these data on the respective storage device 101a, 101b, 101c in an efficient way. For example, the respective storage device 101a, 101b, 101c may include an erase block size for deleting or updating data. The erase block size may be greater than a write block size for writing the data, as it may be the case for SSDs, e.g. NAND SSDs. In this case, a garbage collection function may be used to separate within a single erase block valid data that should be preserved from invalid data that should be deleted to provide storage space for new write operations.

Based on the classification 124 provided for the user data 111, the parity data 113 and/or the log data 115, these data may be stored such that in a single erase block only data with similar statistical lifetimes are stored. This allows to avoid or reduce the garbage collection effort since all data of a single erase block will statistically get invalid substantially at the same time (i.e. after their statistical lifetime or after a pre-defined lifetime) which allows erasing the data of the erase block without previously separating valid data, see for example FIG. 4A and FIG. 4B.

According to various aspects, utilizing the classification 124 of the data may be an efficient way to reduce the write amplification (WA) factor (WAF) in the case that the multiplicity of storage devices have a first granularity for writing data and a second granularity greater than the first granularity for updating or deleting data. This is for example the case if NAND ("not and") memory (e.g., NAND SSDs or NAND-Flash devices) may be used as the storage devices 101.

Figure 8B:
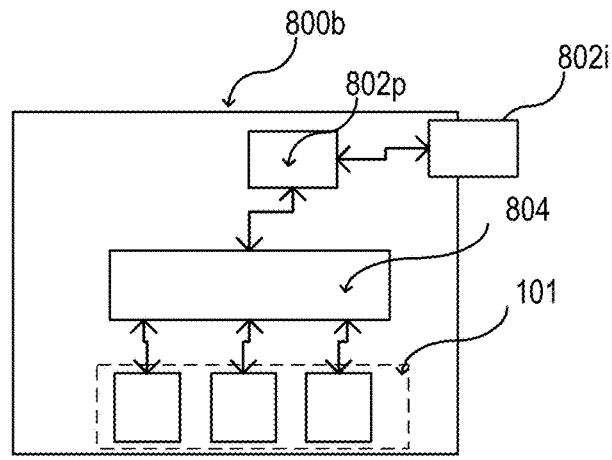
FIG. 8B shows a storage system in a schematic view, according to various aspects.
Figure 8C:
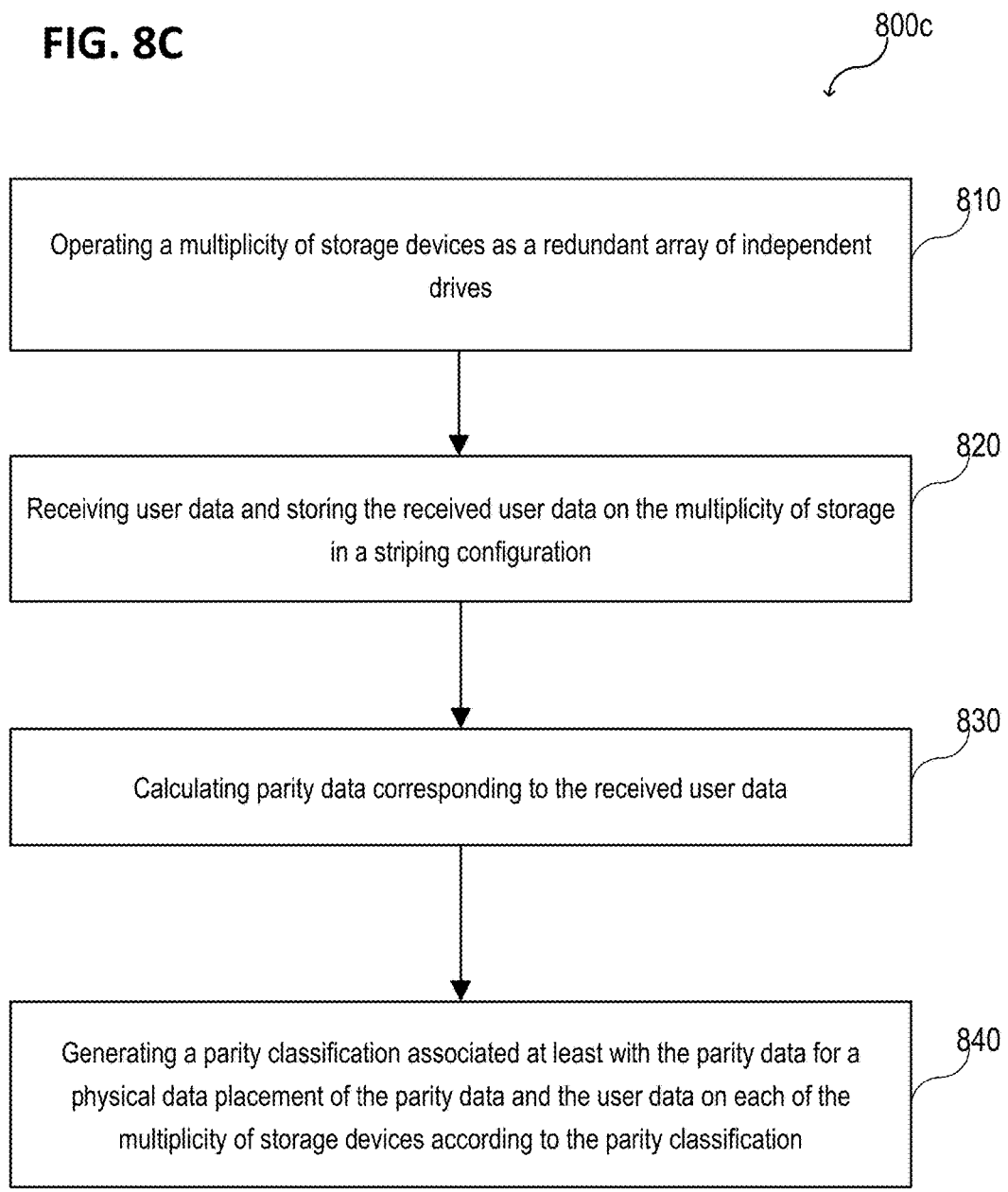
FIG. 8C shows a schematic flow diagram of a method for operating a storage system, according to various aspects.
Figure 9A:
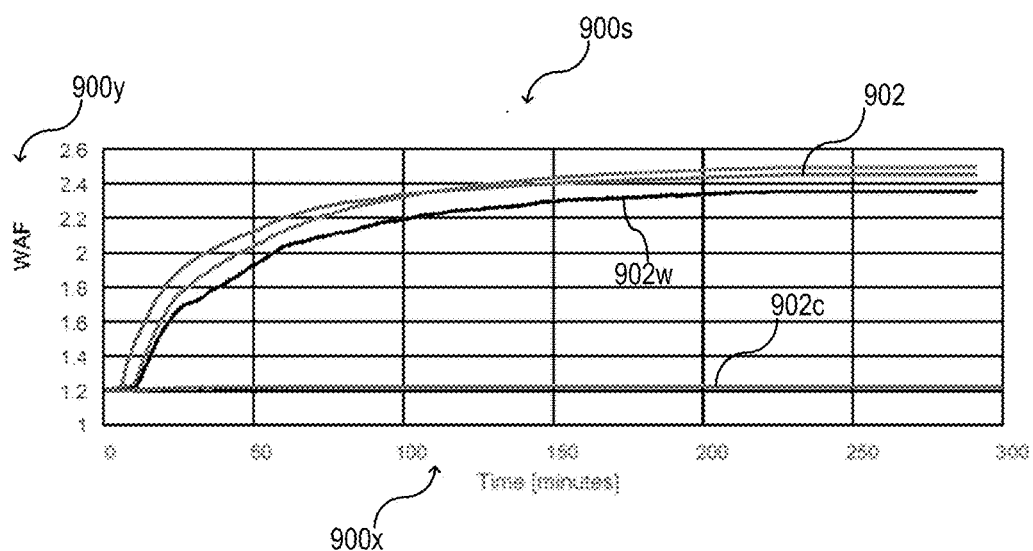
FIGS. 9A and 9B respectively show a write amplification measurement for a storage system, according to various aspects.
Figure 9B:
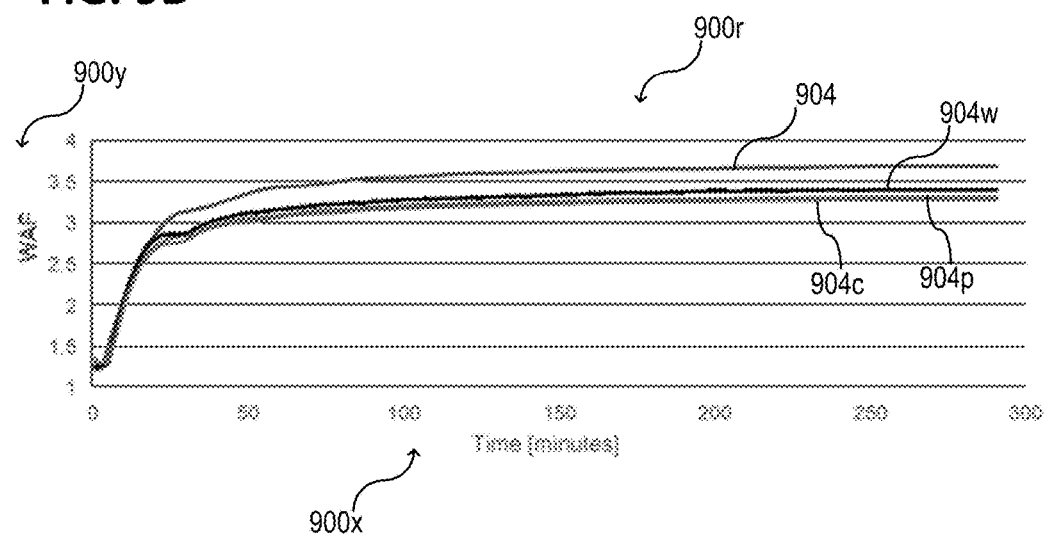

The term write amplification (WA) or write amplification factor (WAF) refers to an effect that occurs when the actual amount of written physical data is more than the amount of logical data that is written by the host computer (see FIGS. 8, 9A and 9B). As an example, a NAND flash memory may include storage elements that have to be erased before they can be rewritten. Further, a NAND flash memory may allow to write a single page at a time (e.g., with a page size of for example 4 kiB to 64 kiB or more), and, however, to erase only one block at a time (also referred to as a NAND block or an erase block). The erase block may include a plurality of pages, e.g., hundreds of pages. Therefore, an internal movement of user data 111 may be carried out, e.g. in a background thread (also referred to as garbage collection), to remove user data 111 (or in other words data that shall remain stored) from a block to be erased. Therefore, the total number of write operations to such types of storage devices may be typically more than the number of write operations intended to be written. The write amplification factor (WAF) is a mathematical representation of this phenomenon and represents a ratio of physical write operations to logical write operations. Small-block random writes may result in a higher WAF and more wear drive than large-block sequential writes, as for example illustrated in FIG. 9A and FIG. 9B. Also "full" drives have in general a higher WAF compared to "empty" drives.

Figure 3:
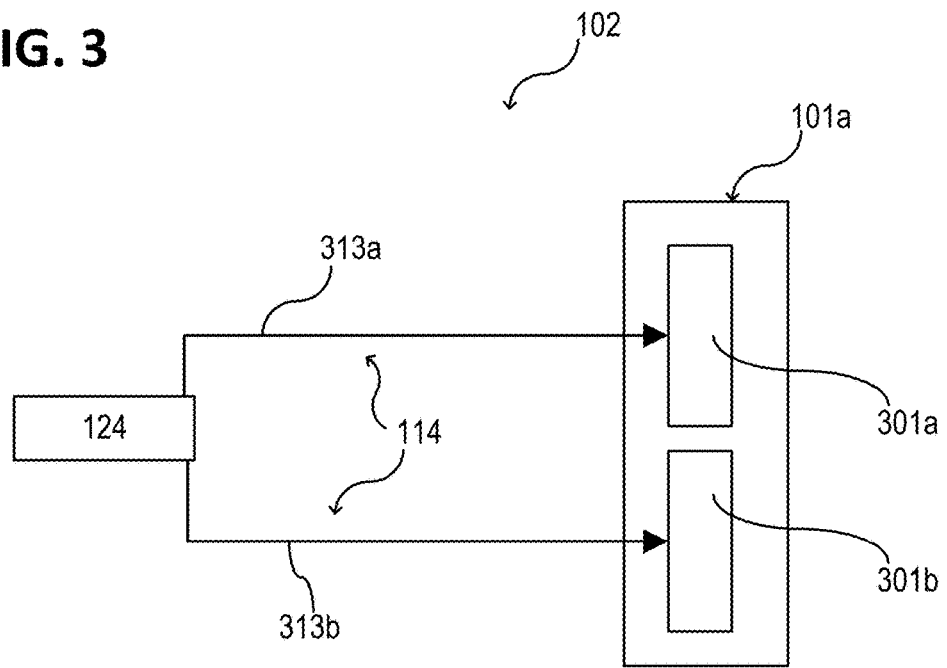
FIG. 3 shows one or more processors of a storage system in a schematic view, according to various aspects.

FIG. 3 illustrates a configuration of one or more processors 102 in a schematic view, according to various aspects. The one or more processors 102 may be part of the storage system 100 described herein. According to various aspects, the one or more processors 102 may be further configured to write 114 the user data 111 and the parity data 113 to each (illustrated exemplarily for the first storage device 101a) of the multiplicity of storage devices 101 by a first data stream 313a directed to a first storage region 301a of the storage device 101a and a second data stream 313b directed to a second storage region 301b of the respective storage device 101a different from the first storage region 301a.

According to various aspects, based on the classification 124, as described above, the one or more processors 102 may be configured so that the first data stream 313a may include only parity data and the second data stream may include user data and parity data. Alternatively, based on the classification 124, as described above, the one or more processors 102 may be configured so that the first data stream 313a may include only parity data 113 and that the second data stream may include only user data 111. Further, based on the classification 124, as described above, the one or more processors 102 may be configured so that the first data stream 313a may include only parity data 113 and log data 115 (e.g., only data with a statistically shorter lifetime) and the second data stream may include (e.g., only) user data 111 (e.g., only data with a statistically longer lifetime).

Illustratively, each of the storage devices 101 may be written in a multi-stream mode. According to various aspects, at least two data streams 313a, 313b may be used to write the data into different blocks of the respective storage device 101 according to the classification associated with the data. This may provide better endurance properties for the storage devices 101, an improved performance of the storage system 100, and/or a consistent latency. All data associated with the first stream 313a may be expected to be invalidated (e.g., updated, deallocated) substantially at the same time.

At the same time, striping can be carried out with the storage devices 101 being arranged in a RAID system, as described above. Using an N-drive array (in other words a storage system 100 with a number of N storage devices 101 in a RAID configuration) as an example, the first bit, byte or block (e.g., write block) may be written to the first drive, the second bit, byte or block to the second drive, and so on, until the (N−1)th bit, byte or block, the parity bit, byte or block is written to the N-th drive. Then, the (N+1)th bit, byte or block is written to the first drive again and the whole process starts over with the for example arranging the parity bit, byte or block on a different drive.

According to various aspects, in the case that a file is written to the RAID storage system 100 using block striping, and the file size is greater than the block size, the file is split into parts having the block size, which may be for example 128 kiB or any other suitable size. The size of this block may be also referred to as strip size. The strip size may be pre-defined. According to various aspects, the strip size may be less than the erase block size.

As for example illustrated in FIG. 3, the first storage region 301a may include another erase block than the second storage region 301b, so that the data streams 313a, 313b write the respective data into different erase blocks to avoid a mixture of data with substantially different lifetimes in a single erase block.

Figure 4A:
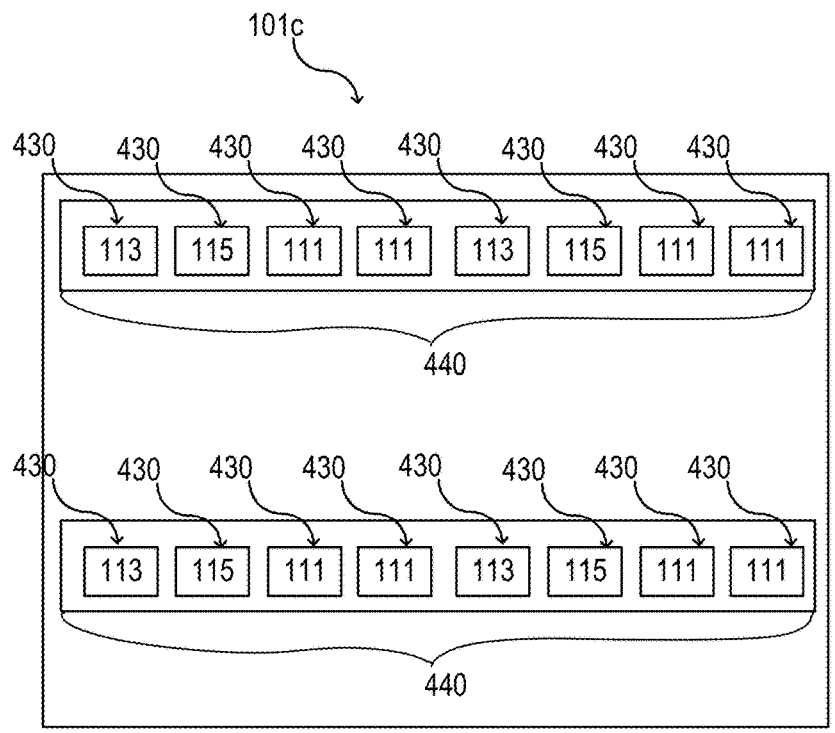
FIGS. 4A to 4C show various writing strategies for non-classified and classified data, according to various aspects.

FIG. 4A illustrates an exemplary distribution of data within two erase blocks 440 on the third storage device 101c of the multiplicity of storage devices 101, as described above, for a sequential write operation, in the case that no classification of the data is provided and the data are written without any specific distribution policy. In this case, after the lifetime of the parity data 113 and/or the log data 115 is expired, the user data 111 that are still valid have to be reallocated into another block before the respective erase block 440 can be erased and a new writing operation can be performed within this erase block 440. According to various aspects, one erase block 440 may include more than one write blocks 430. In other words, each of the of storage devices 101 may have a first granularity for writing data (e.g. writing user data 111, parity data 113 and log data 115) and a second granularity greater than the first granularity for updating or deleting the written data.

According to various aspects, the one or more processors 102 of the storage system 100 may be configured to write the respective data in write blocks 430. The write blocks 430 having a predefined write block size. The respective erase block 440 has an erase block size for erasing or updating data. According to various aspects, the erase block size may be greater than the write block size.

Figure 4B:
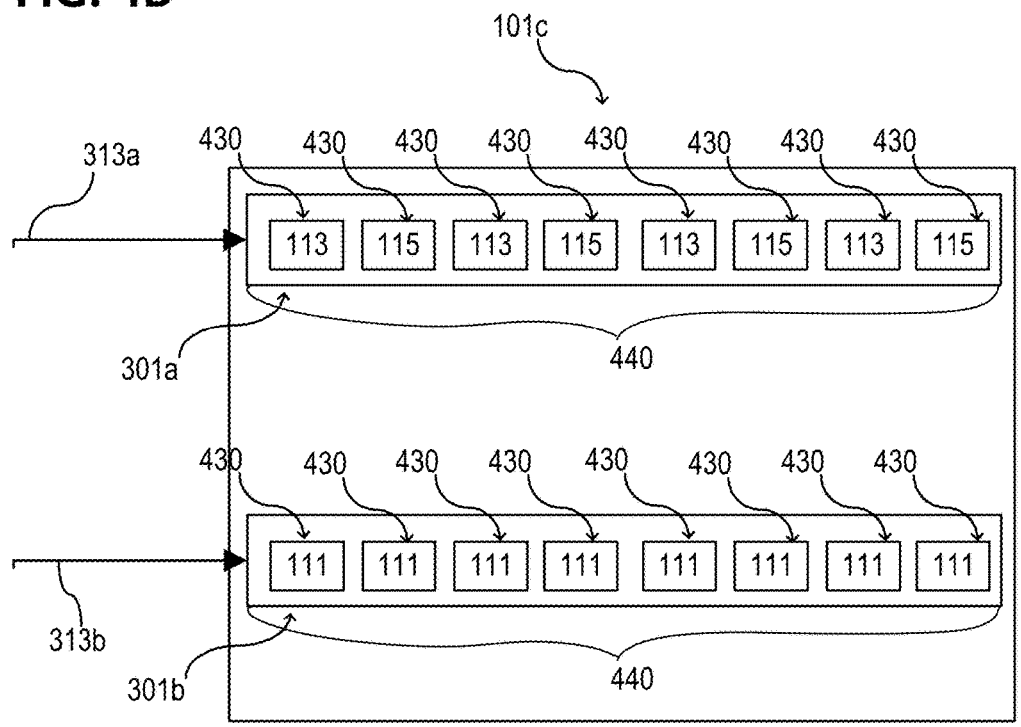

FIG. 4B illustrates an exemplary distribution of data within two erase blocks 440 on the third storage device 101c of the multiplicity of storage devices 101, as described above, for a sequential write operation, in the case that a classification 124 of the data is provided and the data are written according to a specific distribution policy. The distribution policy may be directed to the distribution of data on a single one of the storage devices 101. In this case, the distribution policy may include storing all parity data 113 and all log data 115 into one of the erase blocks 440, e.g., via the first data stream 313a; and storing all user data 111 into another one of the erase blocks 440, e.g., via the second data stream 313b. In this case, after the lifetime of the parity data 113 and the log data 115 is expired (which may be expected to be prior to the expiration of the user data 111), the erase block including the parity data 113 and the log data 115 can be erased and a new writing operation can be performed within this erase block 440, at the same time, the erase block 440 including the user data 111 may remain, since the user data 111 may be still valid.

In this case, according to various aspects, the first data stream 313a may include a low ratio of user data 111 compared to parity data 113 and/or log data 115, e.g., a ratio less than 15%, e.g., less than 10%, e.g., less than 5%, e.g., less than 1%. According to various aspects, the first data stream 313a may be free of user data 111. According to various aspects, the second data stream 313b may include a high ratio of user data 111 compared to parity data 113 and/or log data 115, e.g., a ratio greater than 70%, e.g., greater than 80%, e.g., greater than 90%, e.g., greater than 99%. According to various aspects, the second data stream 313b may be free of parity data 113 and/or log data 115.

As described above, the one or more processors 102 of the storage system 100 may be configured to write the user data 111, the classified parity data 113, and the classified log data 115 on the respective storage device 101a, 101b, 101c via a first data stream 313a and a second data stream 313b. In other words, the one or more processors 102 of the storage system 100 may be configured to write the parity data 113 and the log data 115 on the respective storage device 101a, 101b, 101c via a first data stream 313a according to the classification 124 provided for these data. The first data stream 313a may include only the classified parity data 113 and the classified log data 115 and the second data stream may include (e.g., only) the user data 111.

Figure 4C:
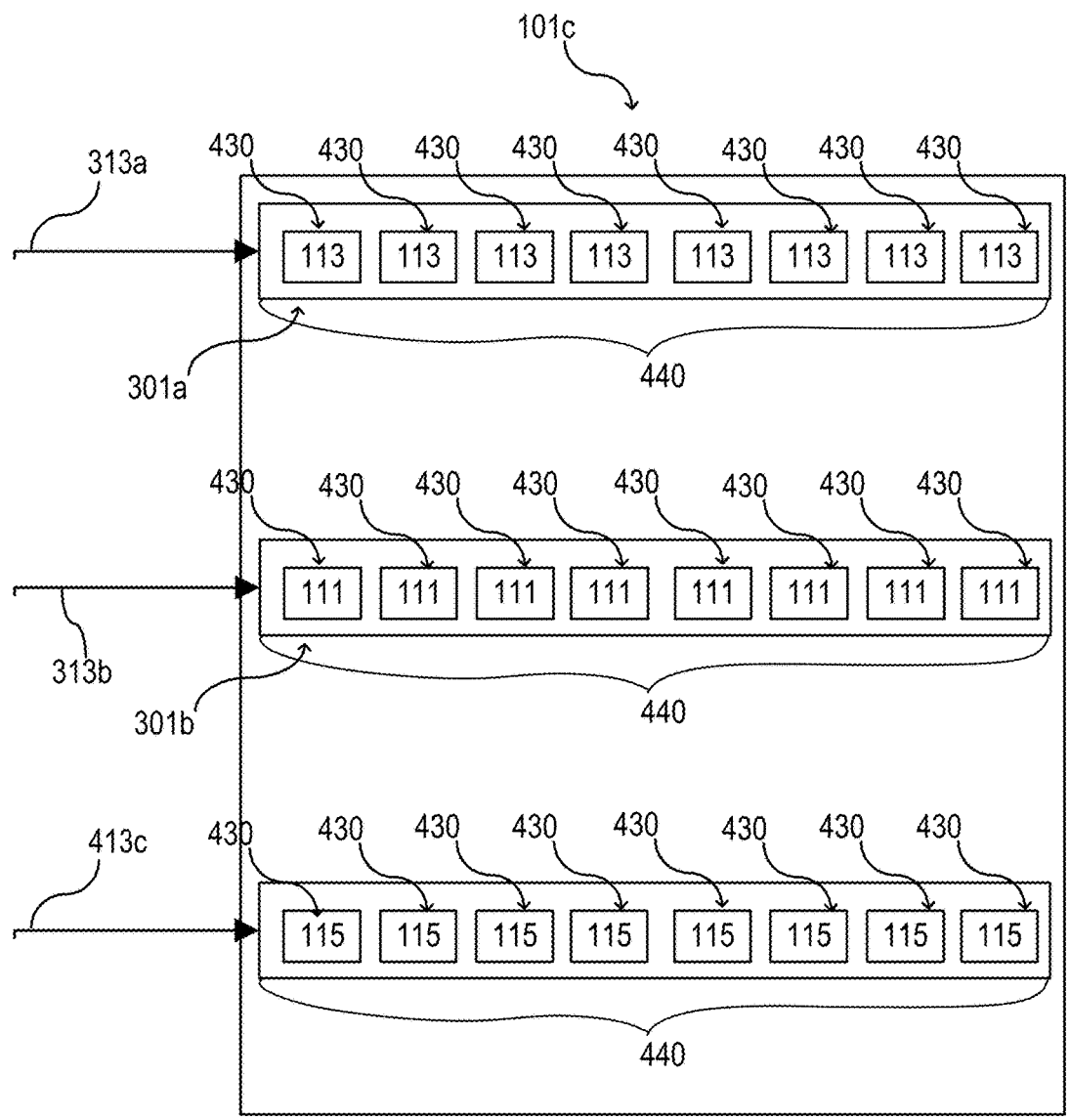

FIG. 4C illustrates an exemplary distribution of data within three erase blocks 440 on the third storage device 101c of the multiplicity of storage devices 101, as described above, for a sequential write operation, in the case that a classification 124 of the data is provided and the data are written according to a specific distribution policy. The distribution policy may be directed to the distribution of data on a single one of the storage devices 101. In this case, the distribution policy may include storing all parity data 113 into a first erase block 440, e.g., via the first data stream 313a; storing all user data 111 into a second erase block 440, e.g., via the second data stream 313b; and storing all log data 115 into a third erase block 440, e.g., via a third data stream 413c. In this case, after the lifetime of the parity data 113 is expired (which is expected to be prior to the expiration of the user data 111), the erase block 440 including the parity data 113 can be erased and a new writing operation can be performed within this erase block 440, at the same time, the erase block 440 including the user data 111 may remain as the user data 111 may be still valid. In a similar way, after the lifetime of the log data 115 is expired (which is expected to be prior to the expiration of the user data 111), the erase block 440 including the log data 115 can be erased and a new writing operation can be performed within this erase block 440, at the same time, the erase block 440 including the user data 111 may remain as the user data 111 may be still valid.

In this case, according to various aspects, the first data stream 313a may include a low ratio of user data 111 and log data 115 compared to parity data 113, e.g., a ratio less than 15%, e.g., less than 10%, e.g., less than 5%, e.g., less than 1%. According to various aspects, the first data stream 313a may be free of user data 111 and log data 115. According to various aspects, the second data stream 313b may include a high ratio of user data 111 compared to parity data 113 and log data 115, e.g., a ratio greater than 70%, e.g., greater than 80%, e.g., greater than 90%, e.g., greater than 99%. According to various aspects, the second data stream 313b may be free of parity data 113 and log data 115. According to various aspects, the third data stream 443c may include a high ratio of log data 115 compared to parity data 113 and user data 111, e.g., a ratio greater than 85%, e.g., greater than 90%, e.g., greater than 95%, e.g., greater than 99%. According to various aspects, the third data stream 413c may be free of parity data 113 and user data 111.

As described above, the one or more processors 102 of the storage system 100 may be configured to write the classified parity data 113 to the respective storage device 101a, 101b, 101c via a first data stream 313a, to write the user data 111 to the respective storage device 101a, 101b, 101c via a second data stream 313b, and to the write log data 115 to the respective storage device 101a, 101b, 101c via a third data stream 413c. In other words, the one or more processors 102 of the storage system 100 may be configured to write the parity data 113 and the log data 115 on the respective storage device 101a, 101b, 101c via two different data streams 313a, 413c according to the classification 124 provided for these data.

According to various aspects, the log data 115 for write hole protection may include information about a write operation of the user data 111 and a corresponding write operation of the parity data 113 associated with the user data 111, as described above.

According to various aspects, the storage system 100 may be a host based RAID.

As described above, a storage system may include a multiplicity of storage devices 101, and one or more processors 102 configured to distribute 114 user data among the multiplicity of storage devices 101 together with corresponding redundancy data 113 (e.g. for data recovery) and with corresponding log data 115, generate a classification 124 associated at least with the redundancy data 113 and the log data 115, and write the redundancy data 113 and the log data 115 in different storage regions within each of the multiplicity of storages devices according to the classification.

FIG. 5 illustrates a schematic flow diagram of a method 500 for operating a storage system, according to various aspects. The method 500 may be carried out in a similar way as described above with respect to the configuration of the storage system 100 and vice versa. According to various aspects, the method 500 may include: in 510, distributing user data 111 on a multiplicity of storage devices 101 together with redundancy data 113 (e.g. for data recovery) and with log data 115 (e.g. for write hole protection); in 520, generating a classification 124 associated with the user data 111, the redundancy data 113, and the log data 115 (e.g., providing classified user data, redundancy data, and classified log data); and, in 530, writing the (classified) user data 111, the (classified) redundancy data 113, and the (classified) log data 115 in different storage regions (e.g. in different storage regions 301a, 301b) within each of the multiplicity of storages devices 101a, 101b, 101c according to the classification 124.

In a similar way, only one of the redundancy data 113 or the log data are classified. In this case, the method 500 may be carried out in a similar way as described above, including for example: distributing user data 111 on a multiplicity of storage devices 101 together with redundancy data 113 (e.g. for data recovery) or with log data 115 (e.g. for write hole protection); generating a classification 124 associated with the user data 111 and associated with the redundancy data 113 or the log data 115; and writing the (classified) user data 111 and writing the (classified) redundancy data 113 or the (classified) log data 115 in different storage regions (e.g. in different storage regions 301a, 301b) within each of the multiplicity of storages devices 101a, 101b, 101c according to the classification 124.

According to various aspects, the different storage regions may be different erase blocks as described above, see FIG. 3 and FIGS. 4A to 4C. The storage regions as referred to herein may be physical regions of the respective storage device.

According to various aspects, the redundancy data 113 may be parity data, e.g., calculated with a XOR operation. However, any other redundancy data 113 that are suitable for data recovery (e.g., in the case that one of the multiplicity of storage devices fails) may be used in a similar way. According to various aspects, log data 115 for write hole protection may be also referred to as write ahead log data.

FIG. 6 illustrates a schematic flow diagram of a method 600 for operating a storage system, according to various aspects. The method 600 may be carried out in a similar way as described above with respect to the configuration of the storage system 100 and vice versa. According to various aspects, the method 600 may include: in 610, dividing at least three storage devices 101a, 101b, 101c into strips 203 and providing a plurality of stripes 201, each of the plurality of stripes 201 including at least three strips 203; in 620, receiving user data 111 and distributing the user data 111 along the stripes 201 together with parity data 113 corresponding to the user data 111 such that each stripe 203 includes at least two user data strips (each user data strip including user data 111) and at least one parity strip associated with the at least two user data strips (the parity data strip including parity data); and, in 630, writing the user data 111 and the parity data 113 to one or more of the storage devices by a first data stream 313a directed to a first storage region 301a of the respective storage device 101a, 101b, 101c and a second data stream 313b directed to a second storage region 301b of the respective storage device 101a, 101b, 101c different from the first storage region 301a such that the first data stream 313a includes (e.g. only) parity data 113 and the second data stream includes (e.g., only) user data 111.

According to various aspects, the method 500, 600 or the storage system 100, as described herein, may be used in Rapid Storage Technology enterprise (Intel RSTe).

According to various aspects, a RAID-5, a RAID-6, or a RAID-EC system may include both parity and write ahead log classification, as described herein. The classification may be used to control a physical data placement one the respective storage devices 101. The physical data placement may include two or more streams for I/O operations.

According to various aspects, based on the classification, one or more stream directives (also referred to herein as distribution policies) may be provided, e.g., for a host based RAID system, where a RAID implementation (e.g., in software, hardware or both) may place data for optimal endurance and performance.

As described in the following in more detail, the storage system 100 and the method provided herein may avoid problems that may occur with parity RAIDs.

One of the problems may be a reduced endurance. In order to provide data reliability in parity RAIDs, parity data may be used in addition to the user data. Partial stripe writes may result in writing parity once per strip update compared to data strips. For an N drive RAID system, the parity strips may be up to N−1 times more likely to be written than user data strips. From an individual member drive (also referred to as member storage device) perspective, mixing shorter lifetime parity strip writes with the longer lifetime data strip writes similarly causes fragmentation inside the member drive, which in turn reduces the overall endurance of the member drive. According to various aspects, a RAID system may be used that is configured to place parity writes into their own erase units (also referred to as erase blocks), these erase units will self-invalidate without causing any fragmentation. In addition, the RAID system may be configured to prevent a write hole by writing write ahead log, which may be stored at the end of each member drive. The write ahead log may be stored in a pre-defined LBA range to which the RAID system may write in a circular buffer fashion. The RAID system may overwrite the LBA range corresponding to the journal much more frequently than the rest of the LBAs on the member drive. The volume of the journal writes may be in some cases about 50% of the total writes. On the member drive, when this much shorter lifetime data (frequently overwritten) are mixed with longer lifetime data, it results in fragmentation inside the SSD. To defrag, the SSD has to relocate valid blocks of data (also referred to as garbage collection), which causes a write amplification and reduced endurance. According to various aspects, the RAID system, as described herein, may place journal writes into their own erase units, these erase units will self-invalidate without causing any fragmentation.

Another one of the problems may be a reduced performance. For example NAND SSDs, before putting new data into the same physical location (also referred to as storage region), must erase it. Erase units (also referred to herein as erase blocks) may have a much bigger granularity than program (e.g., write) units (also referred to herein as write blocks), so before erasing the block, all valid data have to be moved to a new location. Such relocation operations use the same SSD machinery that otherwise is available to a host. This may significantly reduce the performance that the host observes. According to various aspects, a RAID system is provided that reduces the garbage collection; and therefore, the performance improves significantly.

Another one of the problems may be a reduced I/O determinism. In the case that for example an SSD is doing its background garbage collection, the host may observe a much higher latency during such periods. The "Tail" latency may be impacted by being orders of magnitude higher than average or 50th percentile latency. According to various aspects, a RAID system is provided that significantly improve tail latency of one or more workloads.

As already described above, to prevent the problems mentioned above the knowledge about a lifetime of generated parity and logs may be used by the RAID engine. The RAID engine may provide hints about an update frequency together with the data to member drive of the RAID system (e.g., to an SSD). This may apply for example to all RAID levels with parity (e.g., RAID-5, RAID-6, and the like).

According to various aspects, there may be two main hint generators, or in other words, two classifiers; a parity classifier and a write ahead log classifier.

For sequential workloads, the parity classifier may be configured to assign supposed-to-become-invalid parity data to a data stream with very frequently updated data (e.g., the first data stream 313a as described above). According to various aspects, valid parity data may be classified to the same stream as user data.

For random workloads, the parity classifier may be configured to assign each parity data write to a separate data stream (e.g., the first data stream 313a as described above). Statistically, parity data 113 may be updated more frequently than user data 111. The data stream assigned to the parity data 113 may contain other data with a similar update frequency.

The write ahead log classifier may be configured to classify log data 115, which are very frequently updated.

Because of the classification, as described herein, data are placed more efficiently on a member drive. Efficient data placement may reduce drive's background activities, like garbage collection or wear leveling processes.

Figure 7A:
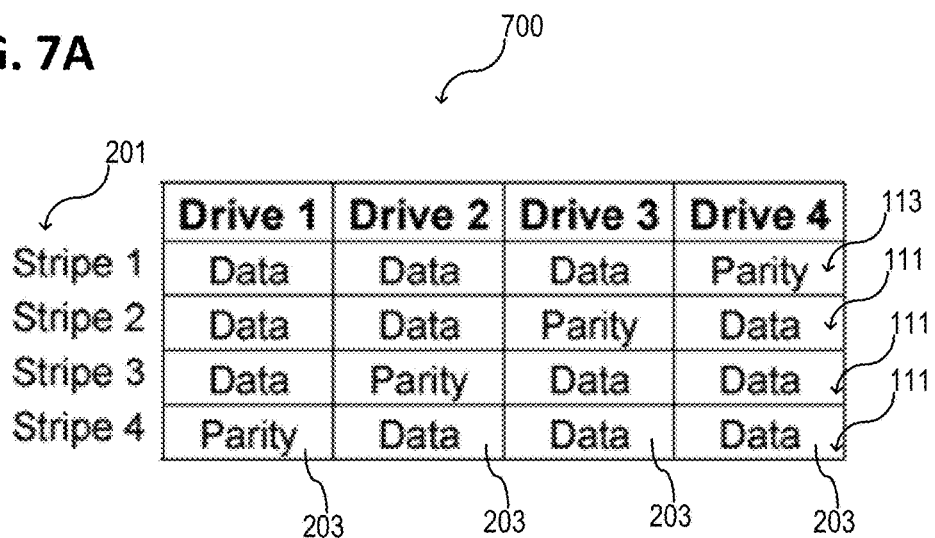
FIGS. 7A to 7C show a writing strategy for classified data, according to various aspects.
Figure 7B:
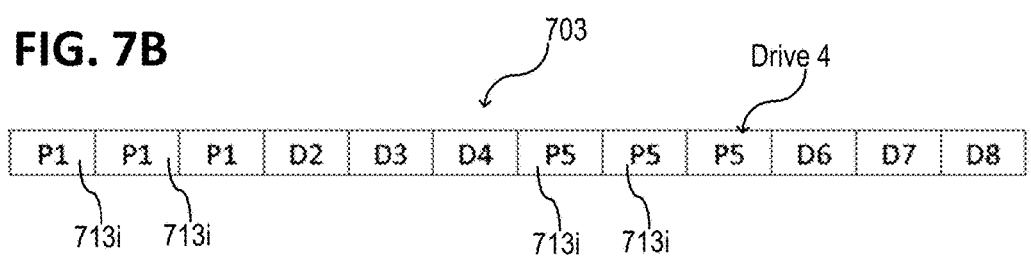
Figure 7C:
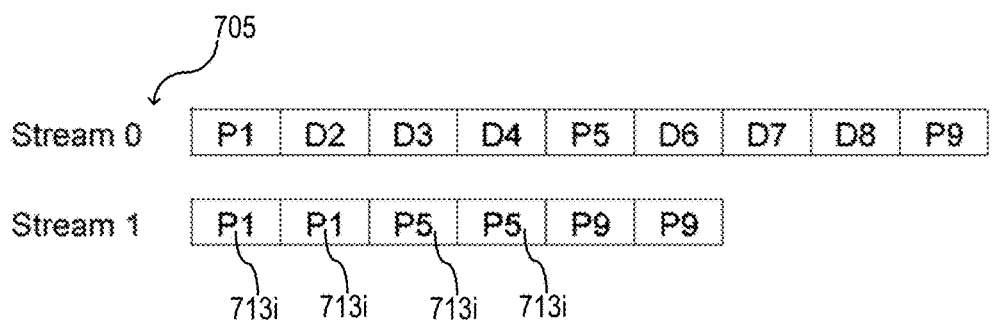

In the following, the RAID technique is illustrated for a RAID-5 configuration with four member drives 401, as illustrated in FIGS. 7A to 7C in schematic views. However, this RAID technique may be applied to other RAID levels in the same or similar way.

FIG. 7A illustrates a RAID-5 data placement 700 for stripe 1 to stripe 4 and member drive 1 to member drive 4 with respect to the parity data 113 and to the user data 111. Each member drive may be divided into strips 203 with equal size. Each cell of the table illustrated in FIG. 7A represents one of the strips 203. In each row of the table represents a stripe 201. In this case, one parity strip and multiple data strips are included on each of the stripes 201.

For sequential workloads, e.g., in the case that a user writes 128 kiB of data to LBA 0 of the RAID-5 volume with a strip size equal to 128 kiB, the following process flow may be carried out:

1. Map LBA 0 to drive 1
 2. Read data from drive 2 and drive 3 to calculate a parity (assuming for example a read-others algorithm is used)
 3. Calculate the parity (e.g., XOR data from drive 2, drive 3 and data for drive 1)
 4. Write data to drive 1 and write parity to drive 4

In the following, the write sequence is illustrated for the case that a user writes data to the RAID-5 volume in a sequential way. In this case, the RAID system will generate following write requests to the member drives:

1. Write data to drive 1, write parity to drive 4
 2. Write data to drive 2, write parity to drive 4
 3. Write data to drive 3, write parity to drive 4
 etc.

The parity will be written once and overwritten twice on a drive 4. From one drive perspective (e.g., from drive 4 perspective), data will be placed on the NAND block for this sequential workload as described in more detail below.

FIG. 7B illustrates a data placement 703 for drive 4 in a schematic view. P1 means parity from Stripe 1, D2 means data from stripe 2, and so on. The parity 713i may be overwritten very quickly and is not valid anymore. However, when a firmware decides the NAND block should be erased, some data would have to be moved to another NAND block before erasing. This consumes time and increases write amplification, as described above. The ideal situation would be that case that the whole block contains only invalid data, since in this case no movements of data have to be carried out.

According to various aspects, by assigning a stream to the parity 713i identified as to become potentially invalid soon, a NAND based drive may be able to place this parity 713*i* into a separate NAND block. According to various aspects, a parity classifier for sequential workload may be utilized as exemplarily illustrated in FIG. 7C in a schematic view and described in the following:

1. Supposed-to-become-invalid parity (in case of above example it means two first parity writes P1, P1, P5, P5, P 9, P9, etc.) is assigned to a different stream 705 than user data (e.g., to stream number 1, where all user data D2, D3, D4, D9, D7, D8, etc. are assigned to stream number 0)

2. Last written in stripe (e.g., a valid) parity block is assigned to the same stream as user data (e.g., to stream number 0)

Based on the streams 705, a NAND based drive may be configured to place invalid parity blocks into one NAND block, but valid parity blocks and user data could be placed into another NAND block:

This RAID technique has the additional benefit of turning the data and parity writes to member drives to sequential (on physical bands) instead of random. This further improves the WAF and the performance.

For a random workload data with two distinct lifetimes are generated, the longer lifetime user data 111 and the shorter lifetime parity data 113, as described herein. This is for example due to the fact that one parity block is "assigned" with multiple user data blocks. For example, for stripe 1, when data is written to drive 1, the parity on drive 4 has to be updated. When data is written to drive 2 or drive 3 in stripe 1, also the parity on drive 4 has to be updated. For RAID-5 systems or similar RAID systems, the parity will be updated up to N−1 more frequently than user data, where N means the number of member drives.

According to various aspects, a parity classifier for random workloads may be configured to assign parity data 113 to a separate stream (e.g., different from the stream with user data 111), as described herein. The stream assigned to the parity data 113 may be used only for random parity, according to various aspects.

According to various aspects, a write ahead log classification may be provided. Parity based RAID levels may for example suffer from a silent data corruption situation known as RAID write hole (RWH). The necessary condition for a RWH to occur is the drive failure followed by an undesired shutdown or vice-versa.

FIG. 8A illustrates a computing system 800*a* in a schematic view, according to various aspects. The computing system 800*a* may include a host system 802 and a storage system 100. The storage system 100 may be configured as described above. The host system 802 may be communicatively coupled to the storage system 100. The host system 802 may include one or more host processors configured to send the user data to be stored to the storage system 100. The host system 802 may be configured to send I/O requests (see reference signs 1 and 5) to a RAID controller 804 (e.g., to one or more processors of a RAID system, as described herein). The RAID controller 804 (also referred to as RAID engine or RAID system) may control four member drives D1, D2, D3, and D4, as described above. However, the RAID controller may be configured to control any other number of member drives, e.g., three or more than three, as described herein. According to various aspects, the host system 802 may be part of the storage system 100. Alternatively, the host system 802 and the storage system 100 may be configured in a remote configuration, where the host system 802 communicates with the remote storage system 100 via any suitable communication network.

Further, FIG. 8A illustrates the reading 2*a*,2*b* and the writing 4*a*, 4*b* of the member drives D1 and D4 (e.g., controlled by the RAID controller 804) including parity calculation 3.

A data corruption situation may occur in the case of an undesired shutdown or a power failure of the host system 802 occurs during a writing step such that a first write operation 4*a* (e.g., user data to drive 1, D1) was completed but the corresponding second write operation 4*b* (e.g., parity data to drive 4, D4) was not. This would leave the corresponding stripe inconsistent such that an XOR operation of any three strips will not result in the fourth strip, as parity would otherwise ensure. On a system restart, if for example a bystander drive 2 (D2) were to fail, no way of reconstructing D2's strip can be provided, because a XOR calculation of D1 and D4 (new and old) will result in garbage data due to the data corruption.

To close the RAID write hole, on every bunch of RAID-5 writes, a write ahead log (WAL) may be used based in log data, as described herein. The write ahead log data may be placed in the metadata portion of the member drive at the end of the drive. The log may be stored on the member drives that stores the parity. Since the write ahead log region at the end of each member drive may be a small LBA range to which the RAID controller 804 (e.g., RSTe) writes the write ahead log in a circular buffer fashion before the write operations 4*a*, 4*b* are carried out, this small LBA range goes through frequent writes. From the member drive perspective, write ahead log is a much shorter lifetime than user data and/or parity. Moreover, in some application the write ahead log can be more than 50% of the total GBs written.

FIG. 8B illustrates a computing system 800*b* in a schematic view, according to various aspects. The computing system 800*b* may include a RAID controller 804 and three or more member drives 101. The RAID controller 804 may be configured as described above. The computing system 800*b* may include one or more processors 802*p* configured to run an operation system (OS) and one or more applications communicating with the RAID controller 804. Alternatively, the one or more processors 802*p* of the computing system 800*b* may be configured to (e.g. remotely) communicate with an external system that runs an operation system (OS) and one or more applications communicating with the RAID controller 804. The computing system 800*b* may be, for example, a server (e.g. as part of a cloud system), a remote storage server, a desktop computer, a laptop, a tablet computer, and the like. The one or more processors 802*p* of the computing system 800*b* may be configured to execute one or more functions of the RAID controller 804. The RAID controller 804 may be implemented in software executed by the RAID controller 804. Alternatively, the RAID controller 804 may be implemented in software executed by the RAID controller 804 and by one or more additional processors, e.g. one or more processors 102 as described above. The computing system 800*b* may include one or more interfaces 802*i* to send and receive data requests associated with data that are stored or are to be stored on the member drives 101 via the RAID controller 804.

FIG. 8C illustrates a schematic flow diagram of a method 800*c* for operating a storage system, according to various aspects. The method 800*c* may be carried out in a similar way as described above with respect to the configuration of the storage system 100 and vice versa. According to various aspects, the method 800*c* may include: in 810, operating a multiplicity of storage devices as a redundant array of independent drives; in 820, receiving user data and storing the received user data on the multiplicity of storage in a striping configuration; in 830, calculating parity data (e.g. for data recovery) associated with the received user data; and, in 840, generating a parity classification associated at least with the parity data for a physical data placement of the parity data and the user data on each of the multiplicity of storage devices according to the parity classification.

According to various aspects, separating different velocity sequential or random I/Os results in WAF reduction. Write ahead log classifier may be configured to assign write log data 115 to a separate stream (see for example FIG. 4C), which yields WAF benefits.

FIG. 9A and FIG. 9B illustrate WAF measurements for various types of classifications. All the measurements were performed using a RAID-5 system, created from three NVMe drives (NVM Express (NVMe) may be also referred to as non-volatile memory host controller interface specification (NVMHCI) that describes a logical device interface specification for accessing non-volatile storage media attached via a PCI Express (PCIe) bus).

One of the measured factor was the write amplification factor (WAF) calculated as:

$$WAF = \frac{\text{bytes written to the memory device}}{\text{bytes written by the host}}$$

A lower value of WAF means less writes to the memory device (e.g., to the flash memories). It correlated with a higher drive endurance and a better performance.

FIG. 9A illustrates the WAF 900y vs. time 900x for sequential writes 900s (e.g., 128 kiB) via a RAID-5 system with raid write hole protection. In the case that both the parity and the write ahead log classifiers are turned on, e.g., depicted as curve 902c, WAF is about two times lower than in the case without classification, depicted as curve 902. In the case that only the write ahead log classifier is turned on, e.g., depicted as curve 902w, WAF is lower than in the case without classification, depicted as curve 902.

FIG. 9B illustrates the WAF 900y vs. time 900x for random writes 900r (e.g., 4 kiB) via a RAID-5 system with raid write hole protection, e.g., using the random parity classifier, as described above. In the case that both the write ahead log and the parity classifiers were used, the WAF benefit may be about 12%, e.g., depicted as curve 904c. In the case that only one of the write ahead log classifier, e.g., depicted as curve 904w, or the parity classifier, e.g., depicted as curve 904p, is used, the WAF may be still lower than without classification, e.g., depicted as curve 904.

Another measured factor was the latency (not illustrated in the figures), e.g., the average latency and the latency of quality of service (QoS).

According to various aspects, the average latency compared to no classification may be improved as follows:

|  | 128 kiB Sequential writes | 4 kiB Random writes |
|---|---|---|
| Parity classification | 104.0% | 89.5% |
| Write ahead log classification | 100.7% | 94.9% |
| Parity and write ahead log classification | 45.5% | 83.4% |

As illustrated above, for sequential workload and both classifiers active, the average latency is more than two times lower than without classification. For random workload, it is about 17% lower than without classification. As a result, a user can access data in RAID volume much faster with the classification, as described herein.

According to various aspects, the average latency quality of service (99.99%) compared to no classification may be improved as follows:

|  | 128 kiB Sequential writes | 4 kiB Random writes |
|---|---|---|
| Parity and write ahead log classification | 40.4% | 97.8% |

As illustrated above, for sequential writes, a maximum RAID volume response time will be more than two times lower with classifiers (in 99.99% time of overall usage) than without classifiers.

Another measured factor was the throughput with a classification, as described herein, compared to no classification.

According to various aspects, the throughput compared to no classification may be improved as follows:

|  | 128 kiB Sequential writes | 4 kiB Random writes |
|---|---|---|
| Parity and write ahead log classification | 221.2% | 115.2% |

As illustrated above, parity and write ahead log classifiers allow accessing data by user more than two times faster than without classification. For random workloads, it is about 15% faster.

According to various aspects, an NVMe/SATA protocol analyzer may be used to analyze write commands to a member drive. Parity writes could be recognized by analyzing LBA or the update frequency. Stream identifier could be read from the write command frame.

According to various aspects, a storage device (e.g., an SSD) may have one or more implemented stream directives and may be paired with RAID system, described herein.

According to various aspects, the storage system 100 (or in other words, the RAID system, RAID engine, RAID controller, etc.) as described herein may provide an improved endurance, an improved performance, an improved QoS, and potential power savings due to minimized garbage collection.

According to various aspects, the log data 115, as described herein, may be part of a write-ahead logging (WAL) implemented in the one or more processors 102 of the storage system 100. The write-ahead logging may include writing all modifications of the user data 111 and/or the parity data 113 to a log before modifications are applied. According to various aspects, the log data 115 may include both redo and undo information. Using WAL may allow applying modifications in-place, which may reduce the extent of modifying indexes and/or block lists.

In the following, various examples are provided with reference to the aspects described above.

Example 1 is a storage system. The storage system may include a multiplicity of storage devices, and one or more processors configured to distribute user data among the multiplicity of storage devices together with redundancy data and log data, to generate a classification associated with the user data, the redundancy data, and the log data, and to write the user data, the redundancy data, and the log data in different storage regions within each storage device of the multiplicity of storage devices according to their respective classification.

In Example 2, the subject matter of Example 1 can optionally include that the redundancy data include parity data.

In Example 3, the subject matter of any one of Examples 1 or 2 can optionally include that the log data include write hole protection data.

In Example 4, the subject matter of any one of Examples 1 to 3 can optionally include that each storage device of the multiplicity of storage devices includes a non-volatile memory, and that the non-volatile memory is configured to storing the user data, the redundancy data and the log data.

In Example 5, the subject matter of any one of Examples 1 to 4 can optionally include that each storage device of the multiplicity of storage devices includes a first granularity associated with writing data, and a second granularity greater than the first granularity, the second granularity being associated with updating or deleting data.

In Example 6, the subject matter of any one of Examples 1 to 5 can optionally include that each storage device of the multiplicity of storage devices includes a solid state drive.

In Example 7, the subject matter of any one of Examples 1 to 6 can optionally include that the one or more processors are configured to distribute the redundancy data across the multiplicity of storage devices.

In Example 8, the subject matter of any one of Examples 1 to 7 can optionally include that the one or more processors are configured to distribute the log data across the multiplicity of storage devices.

In Example 9, the subject matter of any one of Examples 1 to 8 can optionally include that the one or more processors are configured to write at least one of the redundancy data or the log data to a particular storage device of the multiplicity of storage devices via a first data stream, and to write the user data to the particular storage device via a second data stream.

In Example 10, the subject matter of any one of Examples 1 to 8 can optionally include that the one or more processors are configured to write the redundancy data to a particular storage device of the multiplicity of storage devices via a first data stream, to write the user data to the particular storage device via a second data stream, and to write the log data to the particular storage device via the first data stream or a third data stream.

In Example 11, the subject matter of Example 10 can optionally include that the third data stream is substantially free of the user data.

In Example 12, the subject matter of any one of Examples 10 or 11 can optionally include that the third data stream is substantially free of the redundancy data.

In Example 13, the subject matter of any one of Examples 9 to 12 can optionally include that the first data stream is substantially free of the user data.

In Example 14, the subject matter of any one of Examples 9 to 13 can optionally include that the first data stream is substantially free of the log data.

In Example 15, the subject matter of any one of Examples 9 to 14 can optionally include that the second data stream is substantially free of the redundancy data.

In Example 16, the subject matter of any one of Examples 9 to 15 can optionally include that the second data stream is substantially free of the log data.

In Example 17, the subject matter of any one of Examples 9 to 16 can optionally include that the first data stream is directed to a first storage region of a respective storage device of the multiplicity of storage devices, and the second data stream is directed to a second storage region of the respective storage device of the plurality of storage devices, the second storage region being different from the first storage region.

In Example 18, the subject matter of any one of Examples 10 to 12 can optionally include that the first data stream is directed to a first storage region of the respective storage device of the multiplicity of storage devices, the second data stream is directed to a second storage region of the respective storage device of the plurality of storage devices, the second storage region being different from the first storage region, and the third data stream is directed to a further storage region of the respective storage device of the plurality of storage devices, the further storage region being different from the first storage region and the second storage region.

In Example 19, the subject matter of any one of Examples 1 to 18 can optionally include that the one or more processors is or are configured to write the redundancy data, the log data, and the user data as blocks with a write block size.

In Example 20, the subject matter of Example 19 can optionally include that one or more storage devices of the multiplicity of storage devices include an erase block size associated with erasing data, and the erase block size is greater than the write block size.

In Example 21, the subject matter of any one of Examples 1 to 20 can optionally include that the log data include information about a write operation of the user data and a write operation of the redundancy data associated with the user data.

In Example 22, the subject matter of Example 21 can optionally include that the one or more processors are configured to write the user data and redundancy data associated with the log data after the log data is written for the write operation.

In Example 23, the subject matter of any one of Examples 1 to 22 can optionally include that the one or more processors are configured to write the log data or the redundancy data in a circular buffer.

Example 24 is a computing system. The computing system may include a storage system of any one of Examples 1 to 23. The computing system may further include a host system communicatively coupled to the storage system, the host system including one or more host processors configured to send the user data to be stored to the storage system.

Example 25 is a method for operating a storage system. The method may include distributing user data on a multiplicity of storage devices together with redundancy data and with log data, generating a classification associated with the user data, the redundancy data and the log data, and writing the user data, the redundancy data, and the log data in different storage regions within each of the multiplicity of storages devices according to the classification.

In Example 26, the subject matter of Example 25 can optionally include that the redundancy data include parity data.

In Example 27, the subject matter of any one of Examples 25 or 26 can optionally include that the log data include write hole protection data.

In Example 28, the subject matter of any one of Examples 25 to 27 can optionally include that the redundancy data are written across the multiplicity of storage devices.

In Example 29, the subject matter of any one of Examples 25 to 28 can optionally include that the log data are written across the multiplicity of storage devices.

In Example 30, the subject matter of any one of Examples 25 to 29 can optionally include that at least one of the redundancy data or the log data are written to a particular storage device of the multiplicity of storage devices via a first data stream and the user data are written to the particular storage device via a second data stream.

In Example 31, the subject matter of any one of Examples 25 to 29 can optionally include that the redundancy data are written to a particular storage device of the multiplicity of storage devices via a first data stream, and the user data are written to the particular storage device via a second data stream, and the log data are written to the particular storage device via the first data stream or a third data stream.

In Example 32, the subject matter of Example 31 can optionally include that the third data stream is substantially free of the user data.

In Example 33, the subject matter of any one of Examples 31 or 32 can optionally include that the third data stream is substantially free of the redundancy data.

In Example 34, the subject matter of any one of Examples 30 to 33 can optionally include that the first data stream is substantially free of the user data.

In Example 35, the subject matter of any one of Examples 30 to 34 can optionally include that the first data stream is substantially free of the log data.

In Example 36, the subject matter of any one of Examples 30 to 35 can optionally include that the second data stream is substantially free of the redundancy data.

In Example 37, the subject matter of any one of Examples 30 to 36 can optionally include that the second data stream is substantially free of the log data.

In Example 38, the subject matter of any one of Examples 30 to 37 can optionally include that the method further includes directing the first data stream to a first storage region of the respective storage device and directing the second data stream to a second storage region of the respective storage device different from the first storage region.

In Example 39, the subject matter of any one of Examples 31 to 33 can optionally include that the method further includes directing the first data stream to a first storage region of the respective storage device, directing the second data stream to a second storage region of the respective storage device different from the first storage region, and directing the third data stream to a further storage region of the respective storage device different from the first storage region and the second storage region.

In Example 40, the subject matter of any one of Examples 25 to 39 can optionally include that the redundancy data and the log data are written with a write block size, the write block size being less than a minimal erase block size.

In Example 41, the subject matter of any one of Examples 25 to 40 can optionally include that the log data include information about a write operation of the user data and a write operation of the redundancy data associated with the user data.

In Example 42, the subject matter of Example 41 can optionally include that the method further includes writing the log data associated with the write operation prior to the user data and redundancy data associated therewith.

Example 43 is a storage system. The storage system may include one or more processors configured to divide at least three storage devices into strips, to provide a plurality of stripes, each stripe of the plurality of stripes comprising at least three strips, to receive user data, to distribute the user data along the plurality of stripes together with parity data associated with the user data such that each stripe of the plurality of stripes comprises at least two data strips and at least one parity strip associated with the at least two data strips, and to write the user data and the parity data to each storage device of the at least three storage devices based on a first data stream directed to a first storage region of a respective storage device of the at least three storage devices and a second data stream directed to a second storage region of the respective storage device of the at least three storage devices. The second storage region is different from the first storage region. The first data stream includes the parity data, and the second data stream includes the user data.

In Example 44, the subject matter of Example 43 can optionally include that the at least two data strips include user data and the at least one parity strip including parity data.

In Example 45, the subject matter of Example 44 can optionally include that the one or more processors are further configured to write log data associated with the writing of the user data and the parity data to the at least three storage devices.

In Example 46, the subject matter of Example 45 can optionally include that the log data include write hole protection data.

In Example 47, the subject matter of any one of Examples 45 or 46 can optionally include that the one or more processors are configured to distribute the log data across the at least three storage devices.

In Example 48, the subject matter of any one of Examples 45 to 47 can optionally include that the one or more processors are further configured to write the log data to each storage device of the at least three storage devices based on the first data stream directed to the first storage region or based on a third data stream directed to a third storage region of the respective storage device of the at least three storage devices. The third storage region is different from the first storage region and the second storage region.

In Example 49, the subject matter of Example 48 can optionally include that the third data stream is substantially free of the user data.

In Example 50, the subject matter of any one of Examples 48 or 49 can optionally include that the third data stream is substantially free of the parity data.

In Example 51, the subject matter of any one of Examples 43 to 50 can optionally include that the first data stream is substantially free of the user data.

In Example 52, the subject matter of any one of Examples 43 to 51 can optionally include that the first data stream is substantially free of the log data.

In Example 53, the subject matter of any one of Examples 43 to 52 can optionally include that the second data stream is substantially free of the parity data.

In Example 54, the subject matter of any one of Examples 43 to 53 can optionally include that the second data stream is substantially free of the log data.

In Example 55, the subject matter of any one of Examples 43 to 54 can optionally include that each storage device of the at least three storage devices includes a non-volatile memory configured to store the user data and the parity data.

In Example 56, the subject matter of any one of Examples 43 to 55 can optionally include that each storage device of the at least three storage devices has a first granularity associated with writing data and a second granularity greater than the first granularity associated with updating or deleting data.

In Example 57, the subject matter of any one of Examples 43 to 56 can optionally include that each storage device of the at least three storage devices includes a solid state drive.

In Example 58, the subject matter of any one of Examples 43 to 57 can optionally include that the one or more processors are configured to distribute the parity data across the at least three storage devices.

In Example 59, the subject matter of any one of Examples 43 to 58 can optionally include that the one or more processors are configured to write the user data and the parity data respectively with a corresponding write block size, and to erase the user data and the parity data respectively with a corresponding erase block size, the erase block size being greater than the write block size.

In Example 60, the subject matter of any one of Examples 43 to 59 can optionally include that the log data include information about a write operation of the user data and a write operation of the parity data associated with the user data.

In Example 61, the subject matter of Example 60 can optionally include that the one or more processors are configured to write the user data and redundancy data associated with the log data after the log data is written for the write operation.

In Example 62, the subject matter of any one of Examples 43 to 61 can optionally include that the one or more processors are configured to write the log data or the redundancy data in a circular buffer.

Example 63 is a method for operating a storage system. The method may include dividing at least three storage devices into strips and providing a plurality of stripes, each of the plurality of stripes including at least three strips, receiving user data and distributing the user data along the stripes together with parity data associated with the user data such that each stripe includes at least two data strips and at least one parity strip associated with the at least two data strips, and writing the user data and the parity data to one or more of the storage devices by a first data stream directed to a first storage region of the respective storage device and a second data stream directed to a second storage region of the respective storage device different from the first storage region such that the first data stream includes the parity data and the second data stream includes the user data.

In Example 64, the subject matter of Example 63 can optionally include that the method further includes writing log data to each of the at least three storage devices by the first data stream directed to the first storage region or by a third data stream directed to a third storage region of the respective storage device different from the first storage region and the second storage region.

In Example 65, the subject matter of Example 64 can optionally include that the third data stream include only log data.

In Example 66, the subject matter of any one of Examples 63 to 65 can optionally include that the second data stream include only user data.

Example 67 is a non-transitory computer readable medium storing instructions that when executed by a processor cause the processor to perform the method according to any one of the Examples 25 to 42 and any one of the Examples 63 to 66.

Example 68 is a storage system. The storage system may include a multiplicity of storage devices, and one or more processors configured to operate the multiplicity of storage devices as a redundant array of independent drives, to receive user data and to store the received user data on the multiplicity of storage in a striping configuration, to calculate parity data corresponding to the received user data, and to generate a parity classification associated at least with the parity data corresponding to a physical data placement of the parity data and the user data on each of the multiplicity of storage devices according to the parity classification.

In Example 69, the subject matter of Example 68 can optionally include that the one or more processors are configured to provide a first stream and a second stream to write the parity data and the user data to each storage device of the multiplicity of storage devices according to the parity classification. The first stream includes the parity data and the second stream includes the user data.

In Example 70, the subject matter of any one of Examples 68 or 69 can optionally include that the one or more processors are further configured to provide log data associated with the received user data and the calculated parity data, and to generate a log classification associated at least with the log data corresponding to a physical data placement of the log data on each of the multiplicity of storage devices according to the log data classification.

In Example 71, the subject matter of Example 70 can optionally include that the one or more processors are configured to provide a first stream, a second stream, and a third stream to write the parity data, the user data, and the log data to each storage device of the multiplicity of storage devices according to the parity classification and the log data classification. The first stream includes the parity data, the second stream includes the user data, and the third stream includes the log data.

In Example 72, the subject matter of any one of Examples 68 to 71 can optionally include that the one or more processors are configured to provide a first stream and a second stream to write the parity data, the user data, and the log data to each storage device of the multiplicity of storage devices according to the parity classification and the log data classification. The first stream includes the parity data and the log data and the second stream includes the user data.

In Example 73, the subject matter of any one of Examples 68 to 72 can optionally include that each storage device of the multiplicity of storage devices includes a solid state drive.

In Example 74, the subject matter of any one of Examples 68 to 73 can optionally include that each erase block includes a plurality of write blocks associated with writing data into the erase block.

In Example 75, the subject matter of any one of Examples 68 to 74 can optionally include that each storage device of the multiplicity of storage devices includes an erase block size and a write block size, the erase block size being greater than the write block size.

In Example 76, the subject matter of any one of Examples 68 to 75 can optionally include that each storage device of the multiplicity of storage devices includes a first granularity associated with writing data and a second granularity greater than the first granularity associated with updating or deleting data.

In Example 77, the subject matter of any one of Examples 68 to 76 can optionally include that the one or more processors are configured to distribute the parity data across the multiplicity of storage devices.

Example 78 is a method for operating a storage system. The method may include operating a multiplicity of storage devices as a redundant array of independent drives, receiving user data and storing the received user data on the multiplicity of storage in a striping configuration, calculating parity data corresponding to the received user data, and generating a parity classification associated at least with the parity data corresponding to a physical data placement of the parity data and the user data on each of the multiplicity of storage devices according to the parity classification.

In Example 79, the subject matter of Example 78 can optionally include that the method further includes writing the parity data to each storage device of the multiplicity of storage devices via a first stream and writing the user data to each of the multiplicity of storage devices via a second stream according to the parity classification.

In Example 80, the subject matter of any one of Examples 78 or 79 can optionally include that the method further includes providing log data associated with the received user data and the generated parity data, and generating a log classification associated at least with the log data corresponding to a physical data placement of the log data on each of the multiplicity of storage devices according to the log data classification.

In Example 81, the subject matter of Example 80 can optionally include that the method further includes writing the parity data to each of the multiplicity of storage devices via a first stream, writing the user data to each of the multiplicity of storage devices via a second stream according to the parity classification, and writing the log data to each of the multiplicity of storage devices via a third stream.

Example 82 is a storage system. The storage system may include a multiplicity of storage devices, and one or more processors configured to receive user data, to generate auxiliary data associated with the user data, to generate a classification associated with the user data and the auxiliary data, and to distribute the user data and the auxiliary data among the multiplicity of storage devices such that the user data and the auxiliary data are stored in different storage regions within each storage device of the multiplicity of storage devices according to their respective classification.

In Example 83, the subject matter of Example 82 can optionally include that the auxiliary data include redundancy data or log data.

In Example 84, the subject matter of Example 82 can optionally include that the auxiliary data include redundancy data and log data.

In Example 85, the subject matter of any one of Examples 83 or 84 can optionally include that the redundancy data include parity data.

In Example 86, the subject matter of any one of Examples 83 to 85 can optionally include that the log data include write hole protection data.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A storage system, comprising:
   one or more processors configured to
      divide at least three storage devices into strips,
      provide a plurality of stripes, each stripe of the plurality of stripes comprising at least three strips,
      receive user data,
      distribute the user data along the plurality of stripes together with parity data associated with the user data such that each stripe of the plurality of stripes comprises at least two data strips and at least one parity strip associated with the at least two data strips, and
   write the user data and the parity data to each storage device of the at least three storage devices based on a first data stream directed to a first storage region of a respective storage device of the at least three storage devices and a second data stream directed to a second storage region of the respective storage device of the at least three storage devices,
   wherein the second storage region is different from the first storage region,
   the first data stream comprising the parity data, and
   the second data stream comprising the user data.

2. The storage system of claim 1,
   the at least two data strips comprising user data and the at least one parity strip comprising parity data.

3. The storage system of claim 2,
   wherein the one or more processors are further configured to
   write log data associated with the writing of the user data and the parity data to the at least three storage devices.

4. The storage system of claim 3,
   the log data comprising write hole protection data.

5. The storage system of claim 3,
   wherein the one or more processors are configured to distribute the log data across the at least three storage devices.

6. The storage system of claim 3,
   wherein the one or more processors are further configured to
      write the log data to each storage device of the at least three storage devices based on a third data stream directed to a third storage region of the respective storage device of the at least three storage devices,
      the third storage region is different from the first storage region and the second storage region.

7. The storage system of claim 1,
   the first data stream being substantially free of the user data.

8. The storage system of claim 1,
   the second data stream being substantially free of the parity data.

9. The storage system of claim 1,
   wherein each storage device of the at least three storage devices has a first granularity associated with writing data and a second granularity greater than the first granularity associated with updating or deleting data.

10. The storage system of claim 1,
    wherein each storage device of the at least three storage devices comprises a solid state drive.

11. The storage system of claim 1,
    wherein the one or more processors are configured to
       write the user data and the parity data respectively with a corresponding write block size, and
       erase the user data and the parity data respectively with a corresponding erase block size, the erase block size being greater than the write block size.

12. A method for operating a storage system, the method comprising:
    operating a multiplicity of storage devices as a redundant array of independent drives,
       receiving user data and storing the received user data on the multiplicity of storage in a striping configuration,
       calculating parity data corresponding to the received user data,
       generating a parity classification associated at least with the parity data corresponding to a physical data placement of the parity data and the user data on each of the multiplicity of storage devices according to the parity classification, and writing the parity data to each storage device of the multiplicity of storage devices via a first stream and writing the user data to each of the multiplicity of storage devices via a second stream according to the parity classification.

13. A method for operating a storage system, the method comprising:
operating a multiplicity of storage devices as a redundant array of independent drives,
receiving user data and storing the received user data on the multiplicity of storage in a striping configuration,
calculating parity data corresponding to the received user data,
generating a parity classification associated at least with the parity data corresponding to a physical data placement of the parity data and the user data on each of the multiplicity of storage devices according to the parity classification,
providing log data associated with the received user data and the generated parity data,
generating a log classification associated at least with the log data corresponding to a physical data placement of the log data on each of the multiplicity of storage devices according to the log data classification,
writing the parity data to each of the multiplicity of storage devices via a first stream and writing the user data to each of the multiplicity of storage devices via a second stream according to the parity classification, and
writing the log data to each of the multiplicity of storage devices via the first data stream or a third stream.

* * * * *